United States Patent
Liu et al.

(10) Patent No.: US 10,840,299 B2
(45) Date of Patent: Nov. 17, 2020

(54) RESISTIVE RANDOM ACCESS MEMORY CIRCUIT

(71) Applicant: Winbond Electronics Corp., Taichung (TW)

(72) Inventors: Chia-Ming Liu, Kaohsiung (TW); Ting-Ying Shen, Chiayi (TW); Ming-Che Lin, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/558,630

(22) Filed: Sep. 3, 2019

(65) Prior Publication Data

US 2020/0266239 A1 Aug. 20, 2020

(30) Foreign Application Priority Data

Feb. 15, 2019 (TW) .............................. 108105034 A

(51) Int. Cl.
*G11C 11/00* (2006.01)
*H01L 27/24* (2006.01)
*G11C 13/00* (2006.01)

(52) U.S. Cl.
CPC ........ *H01L 27/2436* (2013.01); *G11C 13/004* (2013.01); *G11C 13/0026* (2013.01); *G11C 13/0028* (2013.01)

(58) Field of Classification Search
CPC ............ H01L 27/2436; G11C 13/0026; G11C 13/0028; G11C 13/004
USPC ........................................................ 365/148
See application file for complete search history.

(56) References Cited

U.S. PATENT DOCUMENTS 7,016,222 B2    3/2006  Morikawa
8,619,459 B1 *  12/2013  Nguyen ............... G11C 13/004
                                                           365/148

FOREIGN PATENT DOCUMENTS

TW        201711022 A      3/2017

* cited by examiner

*Primary Examiner* — Huan Hoang
(74) *Attorney, Agent, or Firm* — Muncy, Geissler, Olds & Lowe, P.C.

(57) ABSTRACT

An RRAM circuit includes a first RRAM cell, a second RRAM cell, a first transistor, and a second transistor. The first RRAM cell is coupled between a first bit line and a first node. The second RRAM cell is coupled between a second bit line and the first node. The first transistor includes a first gate terminal, a first drain terminal, and a first source terminal. The first gate terminal is coupled to a first word line, the first drain terminal is coupled to the first node, and the first source terminal is coupled to a first source line. The second gate terminal is coupled to the first word line, the second drain terminal is coupled to the first node, and the second source terminal is coupled to a second source line.

9 Claims, 10 Drawing Sheets

RESISTIVE RANDOM ACCESS MEMORY CIRCUIT

CROSS REFERENCE TO RELATED APPLICATIONS

This Application claims priority of Taiwan Patent Application No. 108105034, filed on Feb. 15, 2019, the entirety of which is incorporated by reference herein.

BACKGROUND OF THE INVENTION

Field of the Invention

The disclosure relates generally to resistive random-access memory (RRAM) circuits, and more particularly it relates to RRAM circuits sharing transistors for increasing the current in the low resistance state.

Description of the Related Art

When performing a reset process on a conventional RRAM, a reverse bias, whose polarity is the opposite of that of the set process, is applied to the RRAM so that current can flow from a lower electrode to an upper electrode. Meanwhile, an oxygen vacancy near the upper electrode could be combined with some of the oxygen ions to interrupt the current path from the lower electrode to the upper electrode, so that the filament breaks around the upper electrode. When performing a set process on a conventional RRAM, a bias, which has the same polarity as that during the process of forming the filament, is applied to the RRAM so that a current can flow from the upper electrode to the lower electrode. Meanwhile, the oxygen ions near the upper electrode are detached to form oxygen vacancy, and the filament may be reformed around the upper electrode.

BRIEF SUMMARY OF THE INVENTION

In an embodiment, an RRAM circuit comprises a first RRAM cell, a second RRAM cell, a first transistor, and a second transistor. The first RRAM cell is coupled between a first bit line and a first node. The second RRAM cell is coupled between a second bit line and the first node. The first transistor comprises a first gate terminal, a first drain terminal, and a first source terminal. The first gate terminal is coupled to a first word line, the first drain terminal is coupled to the first node, and the first source terminal is coupled to a first source line. The second transistor comprises a second gate terminal, a second drain terminal, and a second source terminal. The second gate terminal is coupled to the first word line, the second drain terminal is coupled to the first node, and the second source terminal is coupled to a second source line.

According to an embodiment of the invention, the first drain terminal and the second drain terminal are coupled to the first node of a first metal layer through a first contact and a second contact respectively. The first node is coupled to the first RRAM cell through a first first via, and the first RRAM cell is coupled to the first bit line of a second metal layer through a first second via. The first node is coupled to the second RRAM cell through a second first via, and the second RRAM cell is coupled to the second bit line of the second metal layer through a second second via. The first gate terminal and the second gate terminal are coupled to the first word line of the first metal layer through a third contact. The first source terminal is coupled to the first source line of the first metal layer through a fourth contact, and the second source terminal is coupled to the second source line of the first metal layer through a fifth contact.

According to an embodiment of the invention, the RRAM circuit further comprises a third RRAM cell, a fourth RRAM cell, a third transistor, and a fourth transistor. The third RRAM cell is coupled between a third bit line and a second node. The fourth RRAM cell is coupled between a fourth bit line and the second node. The third transistor comprises a third gate terminal, a third drain terminal, and a third source terminal. The third gate terminal is coupled to a second word line, the third drain terminal is coupled to the second node, and the third source terminal is coupled to a third source line. The fourth transistor comprises a fourth gate terminal, a fourth drain terminal, and a fourth source terminal. The fourth gate terminal is coupled to the second word line, the second drain terminal is coupled to the second node, and the fourth source line is coupled to a fourth source line.

According to an embodiment of the invention, the second word line is coupled to the first word line, the first source line and the third source line are in the first metal layer and coupled to a second metal layer through a first via, the second source line and the fourth source line are in the second metal layer, and the first bit line, the second bit line, the third bit line, and the fourth bit line are in a third metal layer. The second source line overlaps the third source line. When an initialization process is performed on the first RRAM cell and/or the second RRAM cell, a forming process, an initial reset process, a set process, and a reset process are performed in sequence.

According to an embodiment of the invention, when the forming process is performed on the first RRAM cell or the second RRAM cell, the first bit line is coupled to a first voltage, the first word line is coupled to a second voltage, and the second bit line, the first source line, and the second source line are coupled to a around. The first voltage exceeds the second voltage.

According to an embodiment of the invention, when the initial reset process and the reset process are performed on the first RRAM cell, the first word line is coupled to a third voltage, the first bit line is coupled to the ground, and the second bit line, the first source line, and the second source line are coupled to a fourth voltage. The third voltage exceeds the fourth voltage.

According to an embodiment of the invention, when the set process is performed on the first RRAM cell, the first word line is coupled to a fifth voltage, the first bit line is coupled to a sixth voltage, and the second word line, the first source line, and the second source line are coupled to the ground. The fifth voltage exceeds the sixth voltage.

According to an embodiment of the invention, the third bit line is coupled to the first bit line, the fourth bit line is coupled to the second bit line, the third source line is coupled to the first source line, and the fourth source line is coupled to the second source line. When the first RRAM cell and the second RRAM cell both finished the initialization process and the set process is performed on the third RRAM cell, the first bit line is coupled to the fifth voltage, the second word line is coupled to the sixth voltage, the first word line, the first source line, and the second source line are coupled to the ground, and the second bit line is coupled to a seventh voltage. The sixth voltage exceeds the seventh voltage and the seventh voltage is a positive voltage.

According to an embodiment of the invention, when the first word line is coupled to a first read voltage, the first bit line and the second source line are coupled to a second read voltage, and the first source line is coupled to the ground, a read circuit determines whether the first RRAM cell is in a first logic state or a second logic state according to whether a bit current of the first bit line exceeds a first threshold. The first read voltage exceeds the second read voltage.

According to an embodiment of the invention, when the first word line is coupled to the first read voltage, the first bit line is coupled to the second read voltage, and the first source line and the second source line are coupled to the ground, the read circuit determines the first RRAM cell is in a third logic state according to the bit current exceeding a second threshold. The second threshold exceeds the first threshold.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
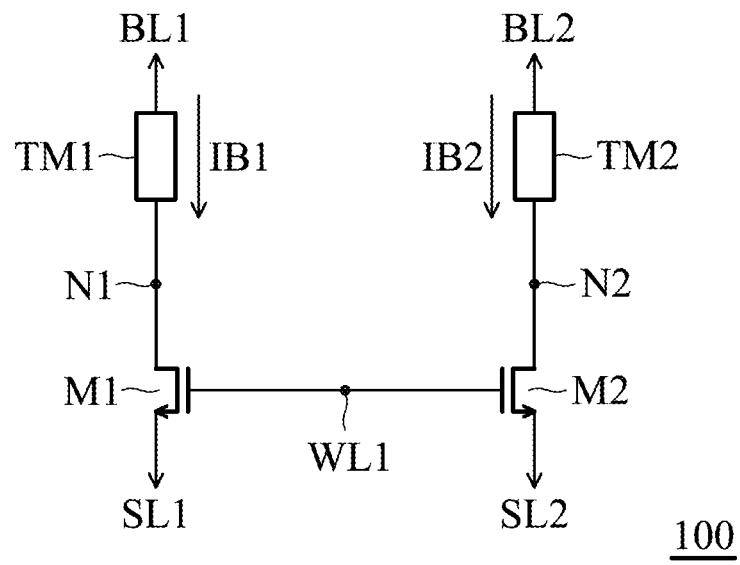
FIG. 1 is a schematic diagram of an RRAM circuit in accordance with an embodiment of the invention.

FIG. 1 is a schematic diagram of an RRAM circuit in accordance with an embodiment of the invention. As shown in FIG. 1, the RRAM circuit 100 includes a first RRAM cell TM1, a second RRAM cell TM2, a first transistor M1, and a second transistor M2.

The first RRAM cell TM1 is coupled between a first bit line BL1 and a first node N1 The second RRAM cell TM2 is coupled between a second bit line BL2 and a second node N2. The gate terminal of the first transistor M1 is coupled to a first word line WL1, the drain terminal of the first transistor M1 is coupled to the first node N1, and the source terminal of the first transistor M1 is coupled to a first source line SL1.

The gate terminal of the second transistor M2 is coupled to the first word line WL1, the drain terminal of the second transistor M2 is coupled to the second node N2, and the source terminal of the second transistor M2 is coupled to a second source line SL2.

According to an embodiment of the invention, when reading the first RRAM cell TM1 or the second RRAM cell TM2, the first transistor M1 or the second transistor M2 is turned ON. A read circuit (not shown in FIG. 1) detects a first bit current IB1 of the first bit line BL1 or a second bit current IB2 of the second bit line BL2 to determine the first RRAM cell TM1 or the second RRAM cell TM2 is in a high resistance state or a low resistance state.

However, since the process parameters may be drafted, the difference of the first bit current IB1 of the first RRAM cell TM1 and/or the second bit current IB2 of the second RRAM cell TM2 in the high resistance state and the low resistance state may not be significant, making it difficult to precisely determine whether the first RRAM cell TM1 and/or the second RRAM cell TM2 is in the high resistance state or the low resistance state. Therefore, the first bit current IB1 and the second bit current IB2 in the low resistance state should be increased for precisely determine whether the RRAM cell is in the high resistance state or the low resistance state.

Figure 2:
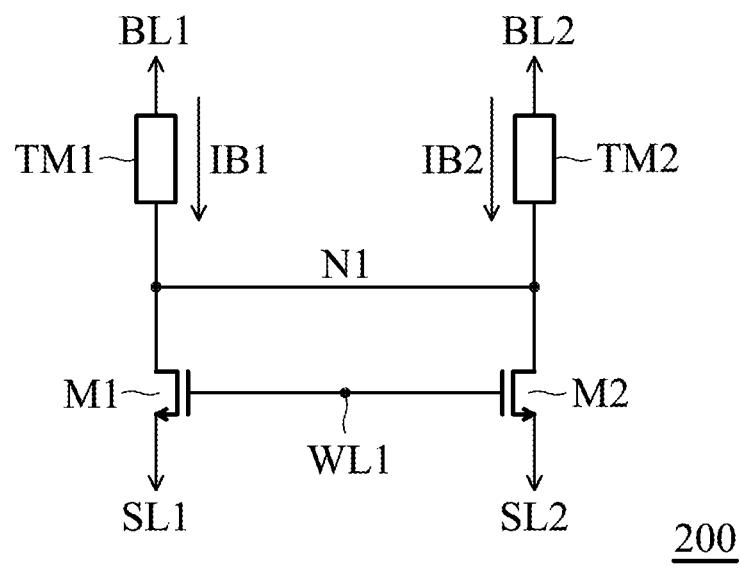
FIG. 2 is a schematic diagram of an RRAM circuit in accordance with another embodiment of the invention.

FIG. 2 is a schematic diagram of an RRAM circuit in accordance with another embodiment of the invention. As shown in FIG. 2, the RRAM circuit 200 also includes the first RRAM cell TM1, the second RRAM cell TM2, the first transistor M1, and the second transistor M2, in which the first RRAM cell TM1, the second RRAM cell TM2, the drain terminal of the first transistor M1, and the drain terminal of the second transistor M2 are coupled to the first node N1.

According to an embodiment of the invention, when reading the first RRAM cell TM1 and/or the second RRAM cell TM2, the first transistor M1 and the second transistor M2 may be both turned ON. Therefore, in the low resistance state, the first bit current IB1 and the second bit current IB2 of the RRAM circuit 200 in FIG. 2 are both significantly greater than the first bit current IB1 and the second bit current IB2 of the RRAM circuit 100 in FIG. 1.

Since the first bit current IB1 and/or the second bit current IB2 of the RRAM circuit 200 in the low resistance state are significantly increased, the read circuit (not shown in FIG. 2) may be easier to determine the first RRAM cell TM1 and/or the second RRAM cell TM2 is in the high resistance state or the low resistance state.

According to another embodiment of the invention, when performing a forming process, an initial reset process, a set process, and/or a reset process on the first RRAM cell TM1 and/or the second RRAM cell TM2, since the first bit current TB1 and/or the second bit current IB2 is significantly increased, it would be helpful for the rate of the first RRAM cell TM1 and/or the second RRAM cell TM2 successfully completing each process.

Figure 3:
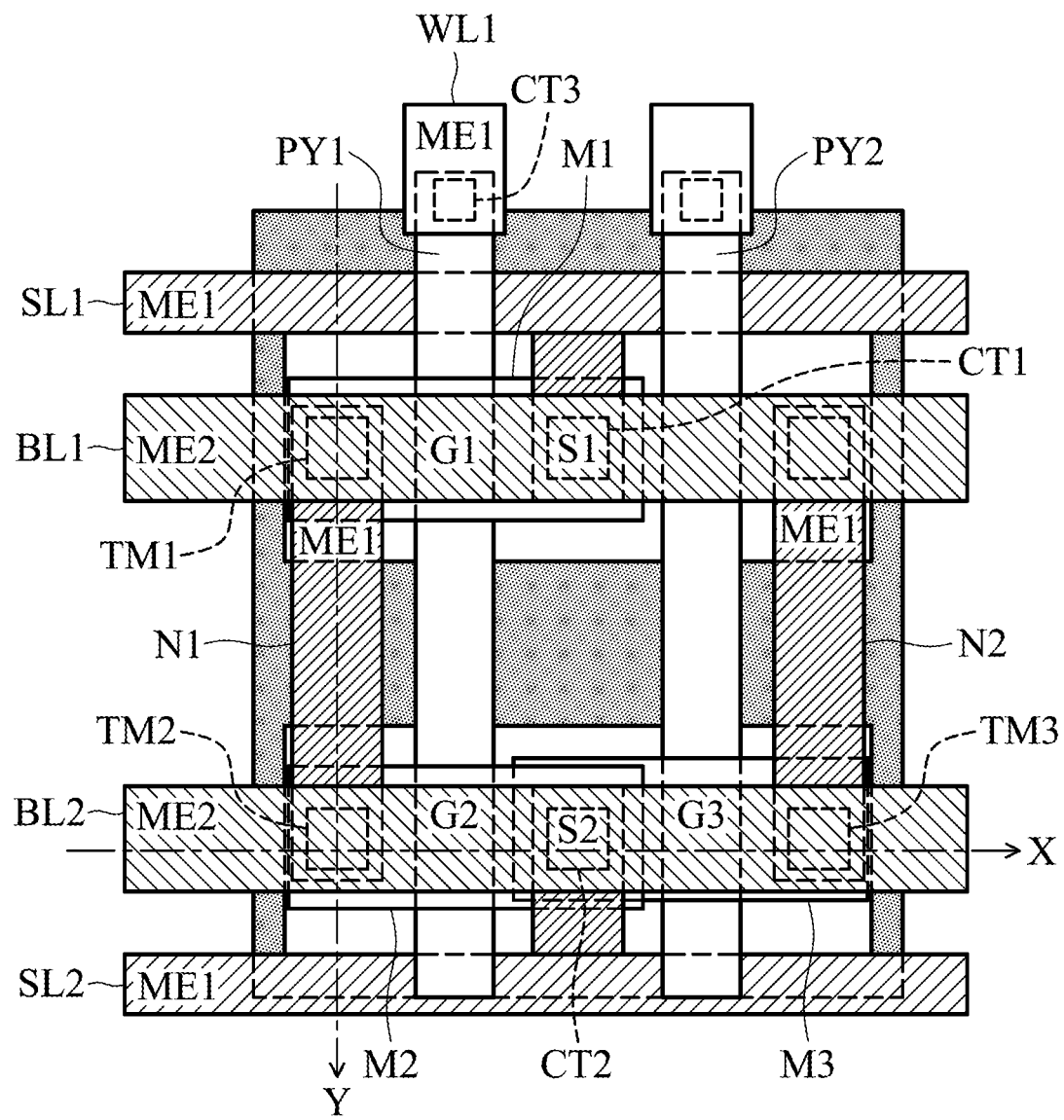
FIG. 3 is a layout of an RRAM circuit in accordance with an embodiment of the invention.

FIG. 3 is a layout of an RRAM circuit in accordance with an embodiment of the invention. According to an embodiment of the invention, the RRAM circuit 300 in FIG. 3 illustrates a layout of the RRAM circuit 200 in FIG. 2.

As shown in FIG. 3, the first source terminal S1 of the first transistor M1 (corresponding to the first transistor M1 in FIG. 2) is coupled to the first source line SL1 of the first metal layer ME1 through the first contact CT1. The first gate terminal G1 of the first transistor M1 is coupled to the first word line WL1 of the first metal layer ME1 through the first polysilicon layer PY1 and the third contact CT3.

The drain terminal of the first transistor M1 (not shown in FIG. 3 and deposited below the first RRAM cell TM1) is coupled to the first node N1 of the first metal layer ME1, in which the first node N1 is coupled to the first bit line BL1 of the second metal layer ME2 through the first RRAM cell TM1.

The second source terminal S2 of the second transistor M2 (corresponding to the second transistor M2 in FIG. 2) is coupled to the second source line SL2 of the first metal layer ME1 through the second contact CT2. The second gate terminal G2 of the second transistor M2 is coupled to the first gate terminal G1 through the first polysilicon layer PY1, and then coupled to the first word line WL1 of the first metal layer ME1 through the third contact CT3.

The drain terminal of the second transistor M2 (not shown in FIG. 3 and deposited below the second RRAM cell TM2) is coupled to the first node N1 of the first metal layer ME1, in which the first node N1 is coupled to the second bit line BL2 of the second metal layer ME2 through the second RRAM cell TM2.

The second transistor M2 and the third transistor M3, which are adjacent, share the second source terminal S2 as there source terminals. In other words, the source terminal of the third transistor M3 is also the second source terminal S2, and the third gate terminal G3 of the third transistor M3 is coupled to the second polysilicon layer PY2. The drain terminal of the third transistor M3 (not shown in FIG. 3 and deposited below the third RRAM cell TM3) is coupled to the second node N2 of the first metal layer ME1, and then coupled to the third RRAM cell TM3.

Figure 4:
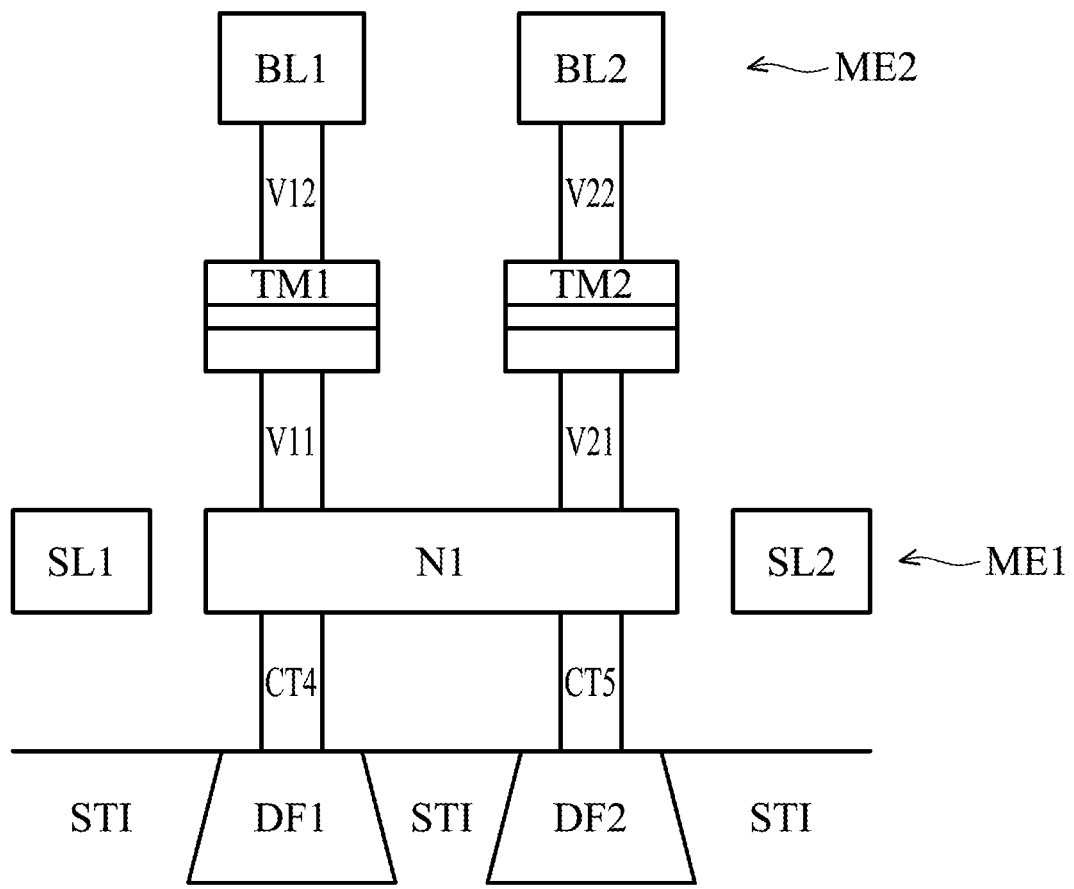
FIG. 4 is a cross-section view of an RRAM circuit in accordance with an embodiment of the invention.

FIG. 4 is a cross-section view of an RRAM circuit in accordance with an embodiment of the invention, in which the RRAM circuit 400 in FIG. 4 is a cross-sectional view along a vertical axis Y shown in FIG. 3.

As shown in FIG. 4, the first diffusion layer DF1 corresponds to the drain terminal of the first transistor M1 in FIG. 2, and the second diffusion layer DF2 corresponds to the drain terminal of the second transistor M2 in FIG. 2. The first diffusion layer DF1 and the second diffusion layer DF2 are isolated from the other by a shallow trench isolation layer ST1.

The first diffusion layer DF1 (i.e., the drain terminal of the first transistor M1 is coupled to the first node N1 of the first metal layer ME1 through the fourth contact CT4. The second diffusion layer DF2 (i.e., the drain terminal of the second transistor M2) is coupled to the first node N1 of the first metal layer ME1 through the fifth contact CT5.

The first node N1 of the first metal layer ME1 is coupled to the first RRAM cell TM1, which corresponds to the first RRAM cell TM1 in FIG. 2, through a first first via V11. The first RRAM cell TM1 is coupled to the first bit line BL1 of the second metal layer ME2 through a first second via V12.

The first node N1 of the first metal layer ME1 is coupled to the second RRAM cell TM2, which corresponds to the second RRAM cell TM2 in FIG. 2, through a second first via V21. The second RRAM cell TM2 is coupled to the second bit line BL2 of the second metal layer ME2 through a second via V22.

As shown in FIG. 4, the first source line SL1 and the second source line SL2 are deposited in the first metal layer ME1, in which the first source line SL1, the second source line SL2, and the first node N1 are isolated from one another.

Figure 5:
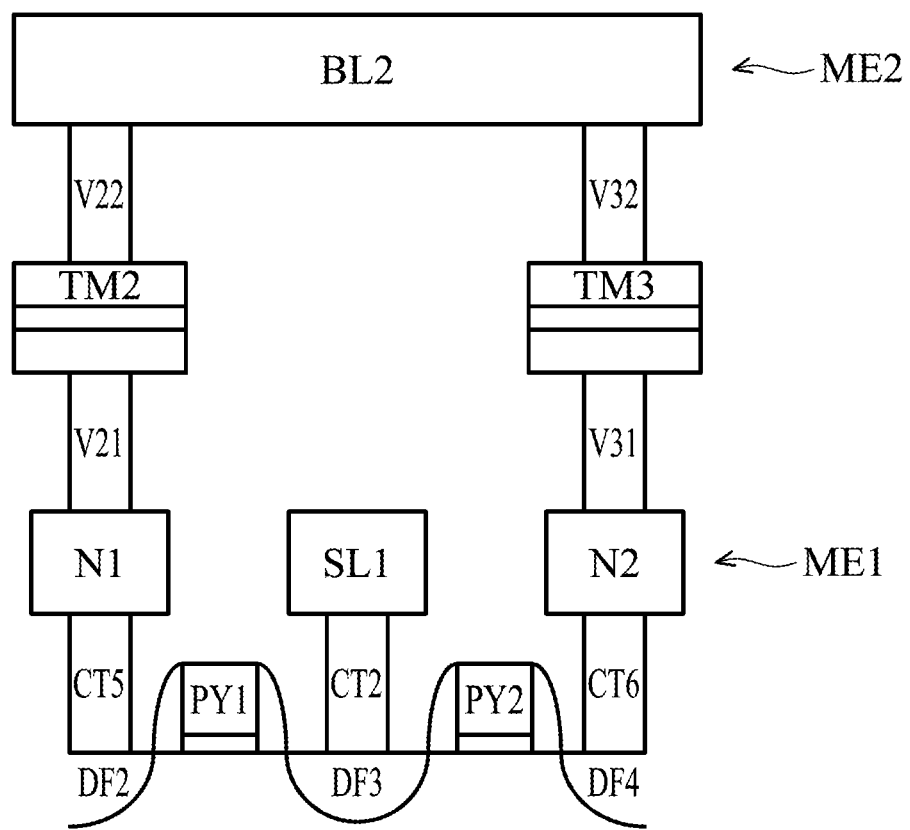
FIG. 5 is a cross-section view of an RRAM circuit in accordance with another embodiment of the invention.

FIG. 5 is a cross-section view of an RRAM circuit in accordance with another embodiment of the invention, in which the RRAM circuit 500 in FIG. 5 is a cross-sectional view along a horizontal axis X shown in FIG. 3.

As shown in FIG. 5, the second diffusion layer DF2 corresponds to the second diffusion layer DF2 in FIG. 4, and also corresponds to the drain terminal of the second transistor M2 in FIG. 2. The third diffusion layer DF3 corresponds to the second source terminal S2 of the second transistor M2 in FIG. 3, and the fourth diffusion layer DF4 corresponds to a drain terminal of another transistor. The first polysilicon layer PY1 corresponds to the first polysilicon layer PY1 in FIG. 3, and the second polysilicon layer PY2 corresponds to the second polysilicon layer PY2 in FIG. 3.

As shown in FIG. 5, the second diffusion layer DF2 is coupled to the first node N1 of the first metal layer ME1 through the fifth contact CT5. The first node N1 is coupled to the second bit line BL2 of the second metal layer ME2 through the second RRAM cell TM2 as illustrated by the RRAM circuit 400 in FIG. 4.

The third diffusion layer DF3 is coupled to the first source line SL1 of the first metal layer ME1 through the second contact CT2. The fourth diffusion layer DF4 is coupled to the second node N2 of the first metal ME1 through the sixth contact CT6. The second node N2 is coupled to the third RRAM cell TM3 through a third first via V31. The third RRAM cell TM3 is coupled to the second bit line BL2 through a third second via V32.

Figure 6:
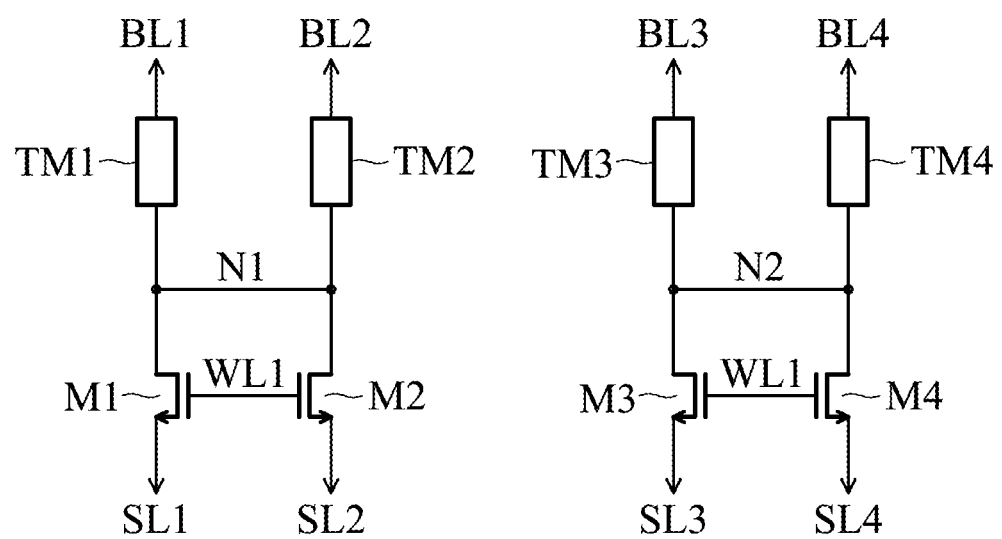
FIG. 6 is a schematic diagram of an RRAM circuit in accordance with another embodiment of the invention.

FIG. 6 is a schematic diagram of an RRAM circuit in accordance with another embodiment of the invention. As shown in FIG. 6, a RRAM circuit 600 includes a first RRAM cell TM1, a second RRAM cell TM2, a third RRAM cell TM3, a fourth RRAM cell TM4, a first transistor M1, a second transistor M2, a third transistor M3, and a fourth transistor M4.

As shown in FIG. 6, the connection of the first RRAM cell TM1 the second RRAM cell TM2, the first transistor M1, and the second transistor M2 is the same as FIG. 1, which will not be repeated herein.

The third RRAM cell TM3 is coupled between the third bit line BL3 and the second node N2. The fourth RRAM cell TM4 is coupled between the fourth bit line BL4 and the second node N2.

The drain terminal of the third transistor M3 is coupled to the second node N2. The gate terminal of the third transistor M3 is coupled to the first word line WL1, The source terminal of the third transistor M3 is coupled to the third source line SL3.

The drain terminal of the fourth transistor M4 is coupled to the second node N2. The gate terminal of the fourth transistor M4 is coupled to the first word line WL1. The source terminal of the fourth transistor M4 is coupled to the fourth source line SL4.

The drain terminal of the fourth transistor M4 is coupled to the second node N2. The gate terminal of the fourth transistor M4 is coupled to the first word line WL1. The source terminal of the fourth transistor M4 is coupled to the fourth source line SL4.

Figure 7:
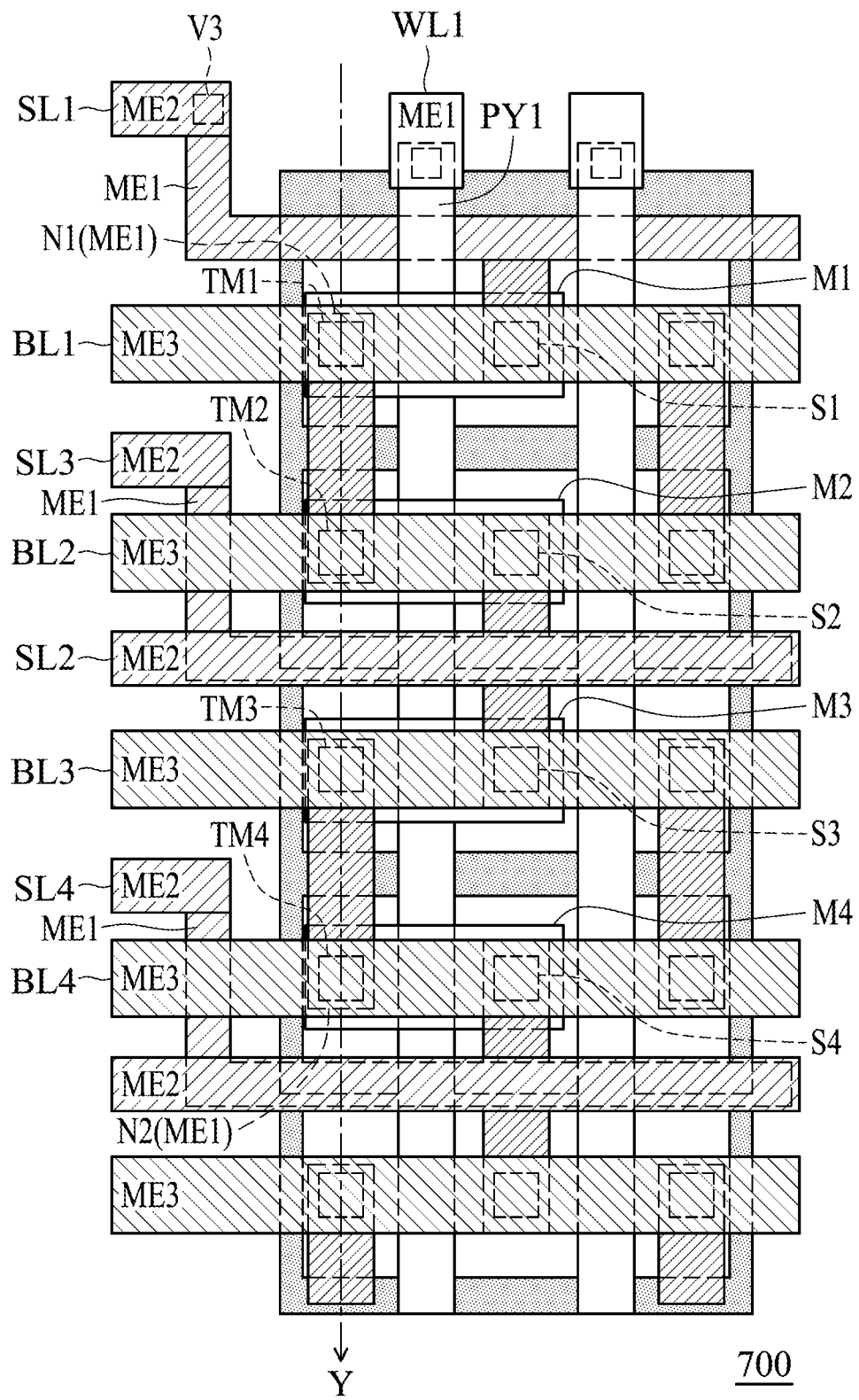
FIG. 7 is a layout of an RRAM circuit in accordance with another embodiment of the invention.

FIG. 7 is a layout of an RRAM circuit in accordance with another embodiment of the invention. According to an embodiment of the invention, the RRAM circuit 700 in FIG. 7 illustrates a layout of the RRAM circuit 600 in FIG. 6.

As shown in FIG. 7, the first node N1 of the first metal layer ME1 is coupled to the drain terminal of the first transistor M1 (not shown in FIG. 7 and deposited below the first RRAM cell TM1) and the drain terminal of the second transistor M2 (not shown in FIG. 7 and deposited below the second RRAM cell TM2). The first source terminal S1 of the first transistor M1 is coupled to the first source line SL1 of the second metal layer ME2 through the first metal layer ME2 and the third via V3.

The gate terminals of first transistor M1, the second transistor M2, the third transistor M3, and the fourth transistor M4 are coupled to the first word line WL1 of the first metal layer ME1 through the first polysilicon layer PY1. The second source terminal S2 of the second transistor M2 is coupled to the second source line SL2 of the second metal layer ME2.

The drain terminal of the third transistor M3 (not shown in FIG. 7 and deposited below the third RRAM cell TM3) and the drain terminal of the fourth transistor M4 (not shown in FIG. 7 and deposited below the fourth RRAM cell TM4) are coupled to the second node N2 of the first metal layer ME1. The third source terminal S3 of the third transistor M3 is coupled to the third source line SL3 of the second metal layer ME2 through the first metal layer ME1. The fourth source terminal S4 of the fourth transistor M4 is coupled to the fourth source line SL4 of the second metal layer ME2. According to an embodiment of the invention, the third source line SL3 overlaps the second source line SL2.

Figure 8:
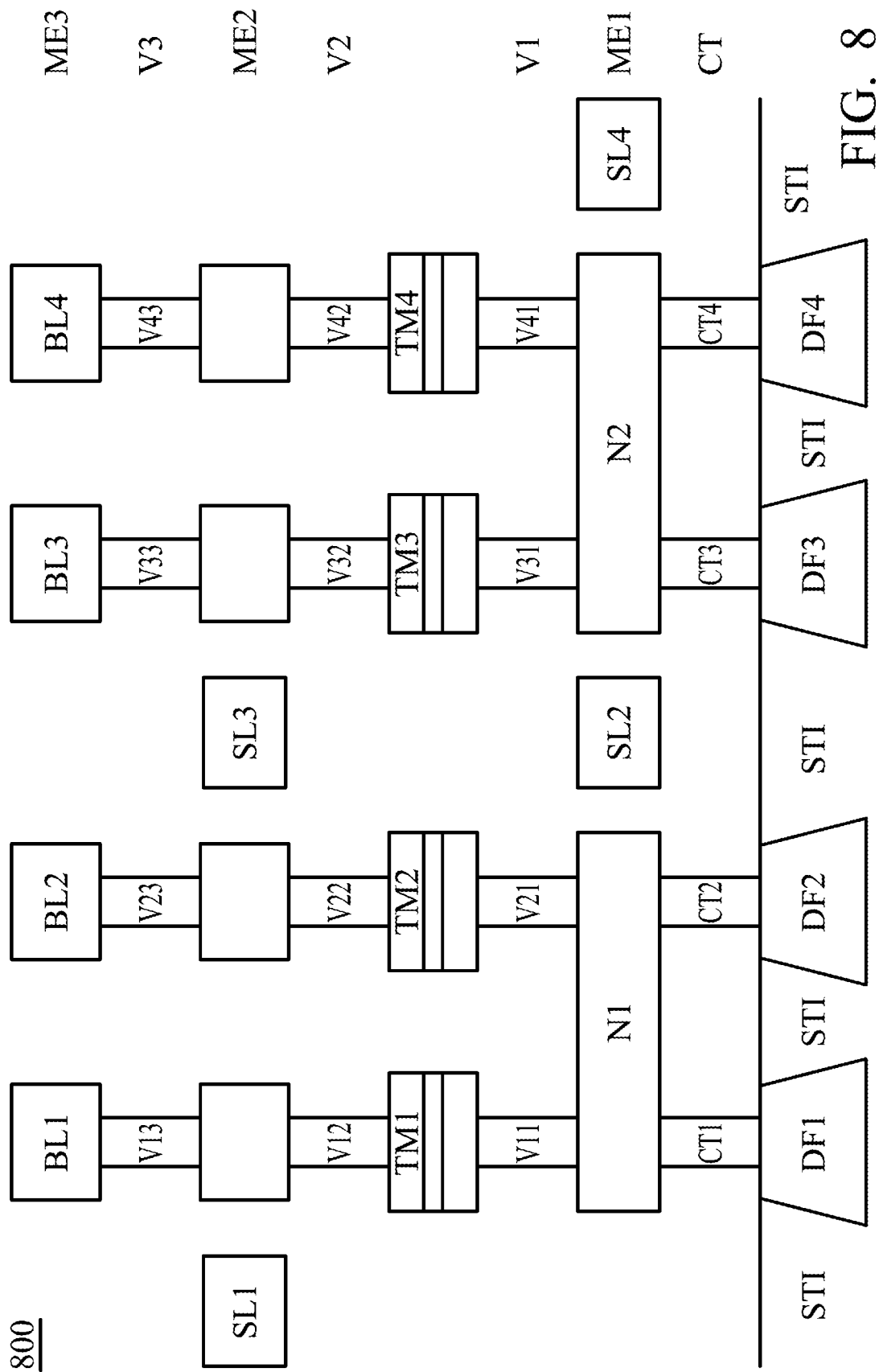
FIG. 8 is a cross-section view of an RRAM circuit in accordance with another embodiment of the invention.

FIG. 8 is a cross-section view of an RRAM circuit in accordance with another embodiment of the invention, in which the RRAM circuit 800 in FIG. 8 is a cross-sectional view along the horizontal axis Y in FIG. 7.

As shown in FIG. 8, the first diffusion layer DF1 is the drain terminal of the first transistor M1, the second diffusion layer DF2 is the drain terminal of the second transistor M2, the third diffusion layer DF3 is the drain terminal of the third transistor M3, and the fourth diffusion layer DF4 is the drain terminal of the fourth transistor M4. The first diffusion layer DF1, the second diffusion layer DF2, the third diffusion layer DF3, and the fourth diffusion layer DF4 are separated from one another by a shallow trench isolation layer ST1.

The first diffusion layer DF1 (i.e., the drain terminal of the first transistor M1 is coupled to the first node N1 of the first metal layer ME1 through the first contact CT1, and the second diffusion layer DF2 (i.e., the drain terminal of the second transistor M2) is coupled to the first node N1 of the first metal layer ME1 through the second contact CT2.

The first node N1 is coupled to the first RRAM cell TM1 through the first first via V11, and then coupled to the first bit line BL1 of the third metal layer ME3 through the second metal layer ME2 and a first third via V13.

The first node N1 is further coupled to the second RRAM cell TM2 through a second first via V21, and then coupled to the second bit line BL2 of the third metal layer ME3 through a second second via V22, the second metal layer ME2, and a second third via V23.

Similarly, the third diffusion layer DF3 (i.e., the drain terminal of the third transistor M3) is coupled to the second node N2 of the first metal layer ME1 through the third contact CT3, and the fourth diffusion layer DF4 (i.e., the drain terminal of the fourth transistor M4) is coupled to the second node N2 of the first metal layer ME1 through the fourth contact CT4.

The second node N2 is coupled to the third RRAM cell TM3 through the third first via V31, and then coupled to the third bit line BL3 of the third metal layer ME3 through the third second via V32, the second metal layer ME2, and a third third via V33.

The second node N2 is further coupled to the second RRAM cell TM2 through a fourth first via V41, and then coupled to the second bit line BL2 of the third metal layer ME3 through a fourth second via V42, the second metal layer ME2, and a fourth third via V43.

As shown in FIG. 8, the second source line SL2 is in the first metal layer ME1, and the third source line SL3 is in the second metal layer ME2. According to an embodiment of the invention, since the first source line SL1 and the third source line SL3 are both in the second metal layer ME2, the second source line SL2 and the fourth source line SL4 shown in FIG. 7 are jumped to the second metal layer ME2 through the third via V3. Therefore, the wire resistance that the first source line SL1 and the second source line SL2 have experienced is the same, and the wire resistance that the third source line SL3 and the fourth source line SL4 have experienced is the same.

According to an embodiment of the invention, since the second source line SL2 overlaps the third source line SL3, the layout of the RRAM circuit 800 is more compact, which lowers the cost of manufacturing the circuit.

FIGS. 9A-9C illustrate an RRAM circuit in accordance with another embodiment of the invention. According to an embodiment of the invention, when performing an initialization process on the RRAM circuit, the forming process, the initial reset process, the set process, and the reset process are sequentially performed.

Figure 9:
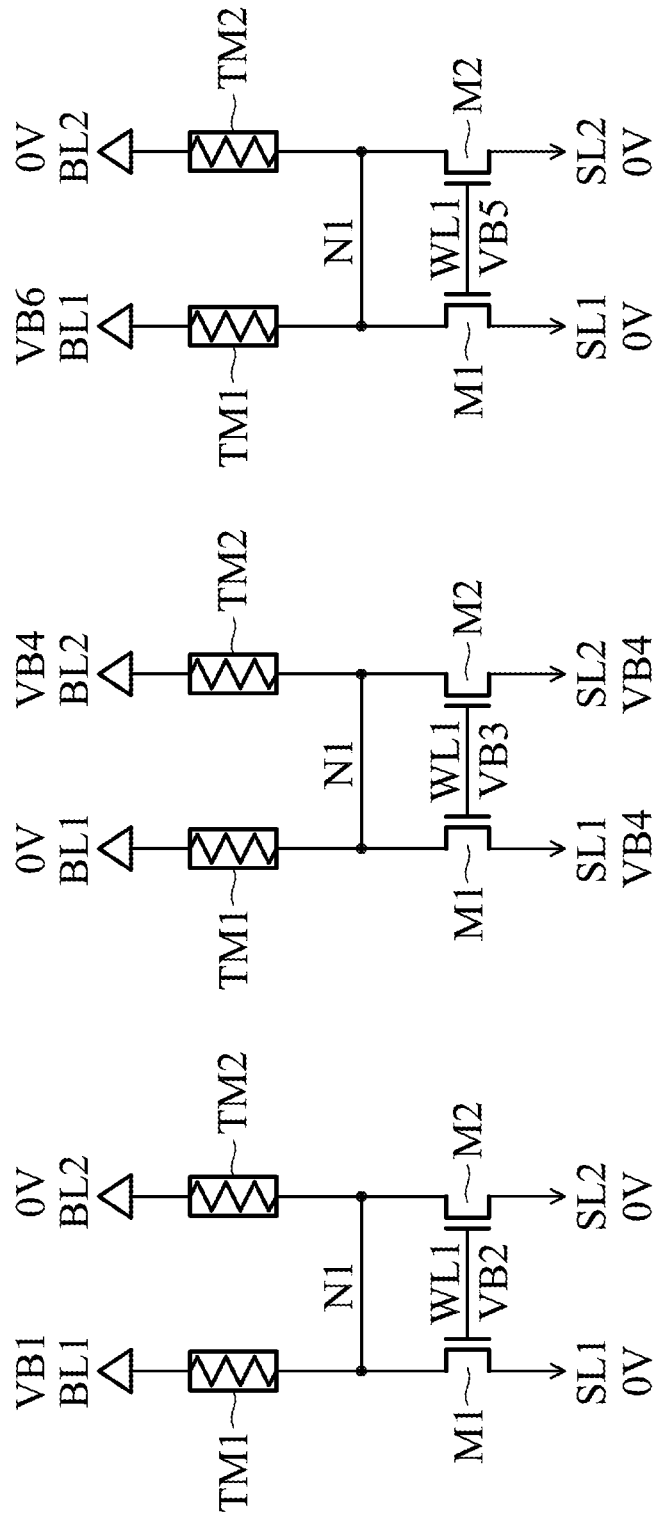
FIGS. 9A-9C illustrate an RRAM circuit in accordance with another embodiment of the invention.

When performing the forming process on the first RRAM cell TM1, as shown in FIG. 9. The first bit line BL1 is coupled to a first voltage VB1 the first word line WL1 is coupled to a second voltage VB2. The second bit line BL2, the first source line SL1, and the second source line SL2 is coupled to the ground. According to an embodiment of the invention, the first voltage VB1 exceeds the second voltage VB2.

When performing the initial reset process and the reset process on the first RRAM cell TM1, as shown in FIG. 9, the first word line WL1 is coupled to a third voltage VB3. The second bit line BL2, the first source line SL1, and the second source line SL2 are coupled to a fourth voltage VB4. The first bit line BL1 is coupled to the ground. According to an embodiment of the invention, the third voltage VB3 exceeds the fourth voltage VB4.

When performing the set process on the first RRAM cell TM1, the first word line WL1 is coupled to the fifth voltage VB5. The first bit line BL1 is coupled to the sixth voltage VB6. The second bit line BL2, the first source line SL1, and the second source line SL2 are coupled to the ground. According to an embodiment of the invention, the fifth voltage VB5 exceeds the sixth voltage VB6.

According to an embodiment of the invention, when the first RRAM cell TM1 finished the initialization process, the first RRAM cell TM1 is in the high resistance state. Since the last step of the initialization process is the reset process, the first RRAM cell TM1 is in the high resistance state after the initialization process is finished. According to other embodiments of the invention, when performing the initialization process on the second RRAM cell TM2, the flow is the same as above, which will not be repeated herein.

Figure 10:
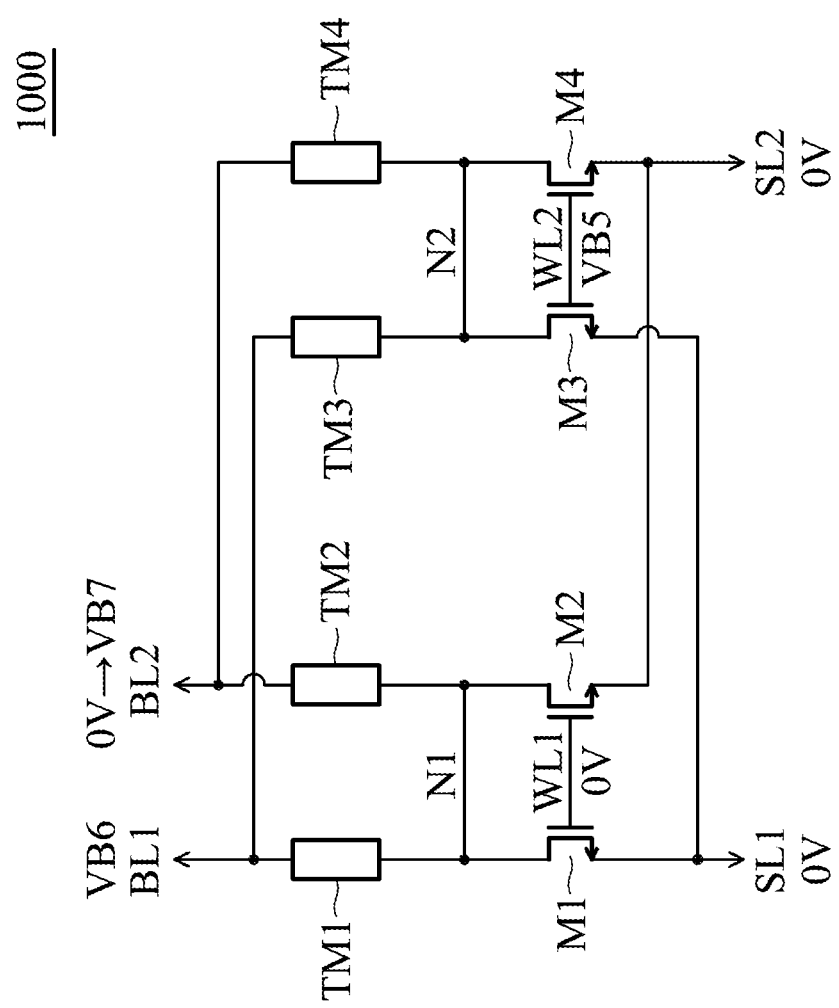
FIG. 10 is a schematic diagram of an RRAM circuit in accordance with an embodiment of the invention.

FIG. 10 is a schematic diagram of an RRAM circuit in accordance with an embodiment of the invention. As shown in FIG. 10, the first RRAM cell TM1 and the third. RRAM cell TM3 are coupled to the first bit line BL1 the second RRAM cell TM2 and the fourth RRAM cell TM4 are coupled to the second bit line BL2, the first transistor M1 and the third transistor M3 are coupled to the first source line SL1, and the second transistor M2 and the fourth transistor M4 are coupled to the second source line SL2.

According to an embodiment of the invention, when the first RRAM cell TM1, the second RRAM cell TM2, the third RRAM cell TM3, and the fourth RRAM cell TM4 both finished the initialization process and the second RRAM cell TM2 is in the low resistance state, the set process is performed on the third RRAM cell TM3. Meanwhile, the second bit line WL2 is coupled to the fifth voltage VB5, the first bit line BL1 is coupled to the sixth voltage VB6, the first word line WL1, the first source line SL1, and the second source line SL2 are coupled to the ground, and the second bit line BL2 is coupled to the seventh voltage VB7, in which the sixth voltage VB6 exceeds the seventh voltage VB7 and the seven voltage VB7 is a positive voltage.

Since the first RRAM cell TM1 and the third RRAM cell TM3 share the first bit line BL1, the first word line WL1 is coupled to the ground to turn OFF the first transistor M1 for the sake of preventing interference to the first RRAM cell TM1 when performing the set process on the third RRAM cell TM3.

Since the first bit line BL1 is coupled to the sixth voltage VB6 and the second RRAM cell TM2 is in the low resistance state, the second bit line BL2 is coupled to the seventh voltage VB7 for the sake of preventing a bit current flowing from the first bit line BL1 to the second bit line BL2 through the first RRAM cell TM1 and the second RRAM cell TM2 from causing malfunction. According to an embodiment of the invention, the seventh voltage VB7 exceeds 0V.

Figure 11A:
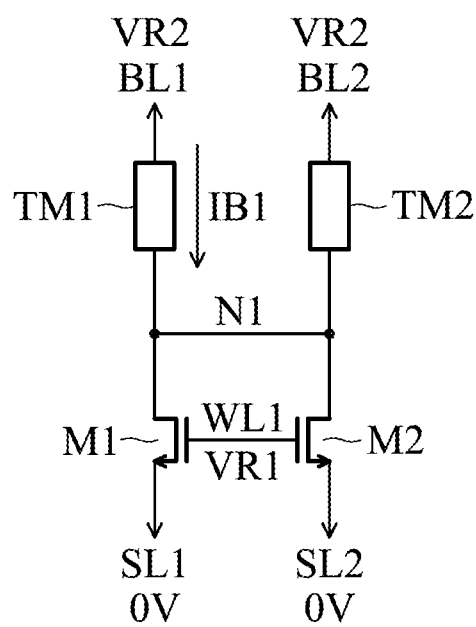
FIGS. 11A-11B illustrate an RRAM circuit performing a read operation in accordance with some embodiments of the invention.
Figure 11B:
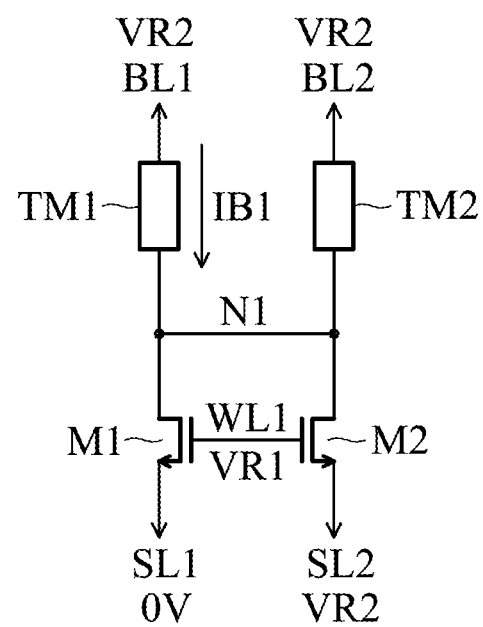

FIGS. 11A-11B illustrate an RRAM circuit performing a read operation in accordance with some embodiments of the invention. Since the read operation performed on the first RRAM cell TM1 or the second. RRAM cell TM2 is identical, the first RRAM cell TM1 is illustrated in the following paragraphs. The read operation performed on the second RRAM cell TM2 is completely the same, which will not be repeated herein.

According to an embodiment of the invention, as shown in FIG. 11A, when the data stored in the first RRAM cell TM1 of the RRAM circuit 1100A is read, the first word line WL1 is coupled to the first read voltage VR1, the first bit line BL1 and the second bit line BL2 are coupled to the second read voltage VR2, the first source line SL1 and the second source line SL2 are coupled to the ground (i.e., 0V), in which the first read voltage VR1 exceeds the second read voltage VR2.

The read circuit (not shown in FIG. 11A) detects the first bit current IB1 of the first bit line BL1 to determine whether the first bit current IB1 exceeds a threshold. Therefore, the read circuit may further determine the first RRAM cell TM1 is in the high resistance state or the low resistance state. According to an embodiment of the invention, when the first bit current IB1 does not exceed the threshold, the read circuit determines the first RRAM cell TM1 is in the high resistance state. According to another embodiment of the invention, when the first bit line current IB1 exceeds the threshold, the read circuit determines the first RRAM cell TM1 is in the low resistance state.

According to an embodiment of the invention, when the first RRAM cell TM1 is read, the second bit line BL2 is coupled to the second read voltage VR2 for preventing a leakage current flowing from the first bit line BL1 to the second bit line BL2 through the first RRAM cell TM1 and the second RRAM cell TM2 from interfering the detected value of the first bit current IB1.

According to an embodiment of the invention, as shown in FIG. 11B, when the data stored in the first RRAMM cell TM1 of the RRAM circuit 1100B is read, the first word line WL1 is coupled to the first read voltage VR1. The first bit line BL1, the second bit line BL2, and the second source line SL2 are coupled to the second read voltage VR2. The first source line SL1 is coupled to the ground (i.e., 0V). The first read voltage VR1 exceeds the second read voltage VR2.

Since the second source line SL2 in FIG. 11B is coupled to the second read voltage VR2, it indicates that only the first transistor M1 is turned ON when the first RRAM cell TM1 is read. Therefore, the first bit current IB1 of the RRAM circuit 1100B is less than the first bit current IB1 of the RRAM circuit 1100A.

According to an embodiment of the invention, when the first RRAM cell TM1 is in the high resistance state, the first bit current IB1 of the RRAM circuit 1100A detected by the read circuit represents a first logic state. When the first RRAM cell TM1 is the low resistance state, the first bit current IB1 of the RRAM circuit 1100A detected by the read circuit represents a second logic state. When the first RRAM cell TM1 is in the low resistance state, the first bit current IB1 of the RRAM circuit 1100B detected by the read circuit represents a third logic state.

In other words, when the first transistor M1 and the second transistor M2 are both turned ON, two different logic states can be generated by the first RRAM cell TM1 in the high resistance state or the low resistance state. When only the first transistor M1 is turned ON, a third logic state can be generated by the first RRAM cell TM1 in the low resistance state.

According to an embodiment of the invention, when the first bit current TB1 does not exceed a first threshold (i.e., the first RRAM cell TM1 is in the high resistance state), the first RRAM cell TM1 is in the first logic state. When the first bit current IB1 exceeds the first threshold but less than a second threshold (i.e., the first RRAM cell TM1 is in the low resistance state and only the first transistor M1 is turned ON), the first RRAM cell TM1 is in the second logic state. When the first bit current IB1 exceeds the second threshold (i.e., the first RRAM cell TM1 is in the low resistance state and the first transistor M1 and the second transistor M2 are both turned ON), the first RRAM cell TM1 is in the third logic state, in which the second threshold exceeds the first threshold.

What is claimed is:

1. A RRAM circuit, comprising:
   a first RRAM cell, coupled between a first bit line and a first node;
   a second RRAM cell, coupled between a second bit line and the first node;
   a first transistor, comprising a first gate terminal, a first drain terminal, and a first source terminal, wherein the first gate terminal is coupled to a first word line, the first drain terminal is coupled to the first node, and the first source terminal is coupled to a first source line; and
   a second transistor, comprising a second gate terminal, a second drain terminal, and a second source terminal, wherein the second gate terminal is coupled to the first word line, the second drain terminal is coupled to the first node, and the second source terminal is coupled to a second source line;
   wherein the first drain terminal and the second drain terminal are coupled to the first node of a first metal layer through a first contact and a second contact respectively, wherein the first node is coupled to the first RRAM cell through a first first via, and the first RRAM cell is coupled to the first bit line of a second metal layer through a first second via, wherein the first node is coupled to the second RRAM cell through a second first via, and the second RRAM cell is coupled to the second bit line of the second metal layer through a second second via, wherein the first gate terminal and the second gate terminal are coupled to the first word line of the first metal layer through a third contact, wherein the first source terminal is coupled to the first source line of the first metal layer through a fourth contact, and the second source terminal is coupled to the second source line of the first metal layer through a fifth contact.

2. The RRAM circuit of claim 1, further comprising:
   a third RRAM cell, coupled between a third bit line and a second node;

a fourth RRAM cell, coupled between a fourth bit line and the second node;

a third transistor, comprising a third gate terminal, a third drain terminal, and a third source terminal, wherein the third gate terminal is coupled to a second word line, the third drain terminal is coupled to the second node, and the third source terminal is coupled to a third source line; and a fourth transistor, comprising a fourth gate terminal, a fourth drain terminal, and a fourth source terminal, wherein the fourth gate terminal is coupled to the second word line, the second drain terminal is coupled to the second node, and the fourth source line is coupled to a fourth source line.

3. The RRAM circuit of claim 2, wherein the second word line is coupled to the first word line, the first source line and the third source line are in the first metal layer and coupled to a second metal layer through a first via, the second source line and the fourth source line are in the second metal layer, and the first bit line, the second bit line, the third bit line, and the fourth bit line are in a third metal layer, wherein the second source line overlaps the third source line, wherein when an initialization process is performed on the first RRAM cell and/or the second RRAM cell, a forming process, an initial reset process, a set process, and a reset process are performed in sequence.

4. The RRAM circuit of claim 3, wherein when the forming process is performed on the first RRAM cell or the second RRAM cell, the first bit line is coupled to a first voltage, the first word line is coupled to a second voltage, and the second bit line, the first source line, and the second source line are coupled to a ground, wherein the first voltage exceeds the second voltage.

5. The RRAM circuit of claim 4, wherein when the initial reset process and the reset process are performed on the first RRAM cell, the first word line is coupled to a third voltage, the first bit line is coupled to the ground, and the second bit line, the first source line, and the second source line are coupled to a fourth voltage, wherein the third voltage exceeds the fourth voltage.

6. The RRAM circuit of claim 5, wherein when the set process is performed on the first RRAM cell, the first word line is coupled to a fifth voltage, the first bit line is coupled to a sixth voltage, and the second word line, the first source line, and the second source line are coupled to the ground, wherein the fifth voltage exceeds the sixth voltage.

7. The RRAM circuit of claim 6, wherein the third bit line is coupled to the first bit line, the fourth bit line is coupled to the second bit line, the third source line is coupled to the first source line, and the fourth source line is coupled to the second source line, wherein when the first RRAM cell and the second RRAM cell both finished the initialization process and the set process is performed on the third RRAM cell, the first bit line is coupled to the fifth voltage, the second word line is coupled to the sixth voltage, the first word line, the first source line, and the second source line are coupled to the ground, and the second bit line is coupled to a seventh voltage, wherein the sixth voltage exceeds the seventh voltage and the seventh voltage is a positive voltage.

8. The RRAM circuit of claim 1, wherein when the first word line is coupled to a first read voltage, the first bit line and the second source line are coupled to a second read voltage, and the first source line is coupled to the ground, a read circuit determines whether the first RRAM cell is in a first logic state or a second logic state according to whether a bit current of the first bit line exceeds a first threshold, wherein the first read voltage exceeds the second read voltage.

9. The RRAM circuit of claim 8, wherein when the first word line is coupled to the first read voltage, the first bit line is coupled to the second read voltage, and the first source line and the second source line are coupled to the ground, the read circuit determines the first RRAM cell is in a third logic state according to the bit current exceeding a second threshold, wherein the second threshold exceeds the first threshold.

* * * * *